US010497442B1

(12) United States Patent
Kumar et al.

(10) Patent No.: US 10,497,442 B1
(45) Date of Patent: Dec. 3, 2019

(54) MEMRISTOR ARRAYS IN CROSSBARS

(71) Applicant: HEWLETT PACKARD ENTERPRISE DEVELOPMENT LP, Houston, TX (US)

(72) Inventors: Suhas Kumar, Palo Alto, CA (US); Rui Liu, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 16/191,653

(22) Filed: Nov. 15, 2018

(51) Int. Cl.
*G11C 13/00* (2006.01)
*G06F 9/30* (2018.01)
*H01L 27/24* (2006.01)
*G06F 17/16* (2006.01)

(52) U.S. Cl.
CPC ...... *G11C 13/0069* (2013.01); *G06F 9/30014* (2013.01); *G06F 17/16* (2013.01); *G11C 13/004* (2013.01); *H01L 27/2463* (2013.01); *G11C 2013/0045* (2013.01)

(58) Field of Classification Search
CPC .............. G11C 13/0069; G11C 13/004; G06F 9/30014; G06F 17/16; H01L 27/2463
USPC .......................................................... 365/148
See application file for complete search history.

(56) References Cited

U.S. PATENT DOCUMENTS 7,859,882 B2 * 12/2010 Cho ......................... G11C 8/14 365/148
9,152,827 B2 10/2015 Linderman et al.
9,659,249 B1 5/2017 Copel
9,715,655 B2 7/2017 Wu et al.
9,910,827 B2 3/2018 Muralimanohar et al.
10,008,264 B2 6/2018 Ge et al.
2007/0233761 A1 * 10/2007 Mouttet .................. G06F 7/607 708/204
2017/0316827 A1 * 11/2017 Ge ....................... G11C 7/1006
2018/0018559 A1 1/2018 Yakopcic et al.
2018/0075339 A1 3/2018 Ma et al.

OTHER PUBLICATIONS

Cory Merkel, “Current-mode Memristor Crossbars for Neuromemristive Systems,” arXiv:1707.05316v1, Jul. 17, 2017, pp. 1-6.

* cited by examiner

*Primary Examiner* — Xiaochun L Chen
(74) *Attorney, Agent, or Firm* — Tong, Rea, Bentley & Kim, LLC

(57) ABSTRACT

In example implementations, a memory cell is provided. The memory cell includes a plurality of row lines and a plurality of column lines. The plurality of row lines and the plurality of column lines intersect to form a 2×2 array. The memory cell may include a plurality of memristors. A memristor is coupled to each unique combination of a row line and a column line in the 2×2 array. An input line is coupled to a first row of memristors. An invert is coupled to the input line. An inverted input line from the inverter is coupled to the second row of memristors.

20 Claims, 5 Drawing Sheets

MEMRISTOR ARRAYS IN CROSSBARS

BACKGROUND

A resistive memory array can be utilized to perform analog computations that exploit the fundamental relationship between row voltage and column current in a resistive mesh to realize an analog multiply-accumulate unit. Such a unit may be faster than a digital computation, and may also consume significantly less energy than traditional digital functional units. The memory array is typically organized as a grid of cells interconnected by horizontal and vertical wires, referred to as word/row lines and bit/column lines. The fundamental relationship between a row access voltage and a resulting bit line current can act as an analog multiplier of row voltage and memory array cell conductance. Instead of accessing a single row as performed for loading and storing data, multiple rows can be activated concurrently according to an input voltage vector.

DETAILED DESCRIPTION

Figure 1:
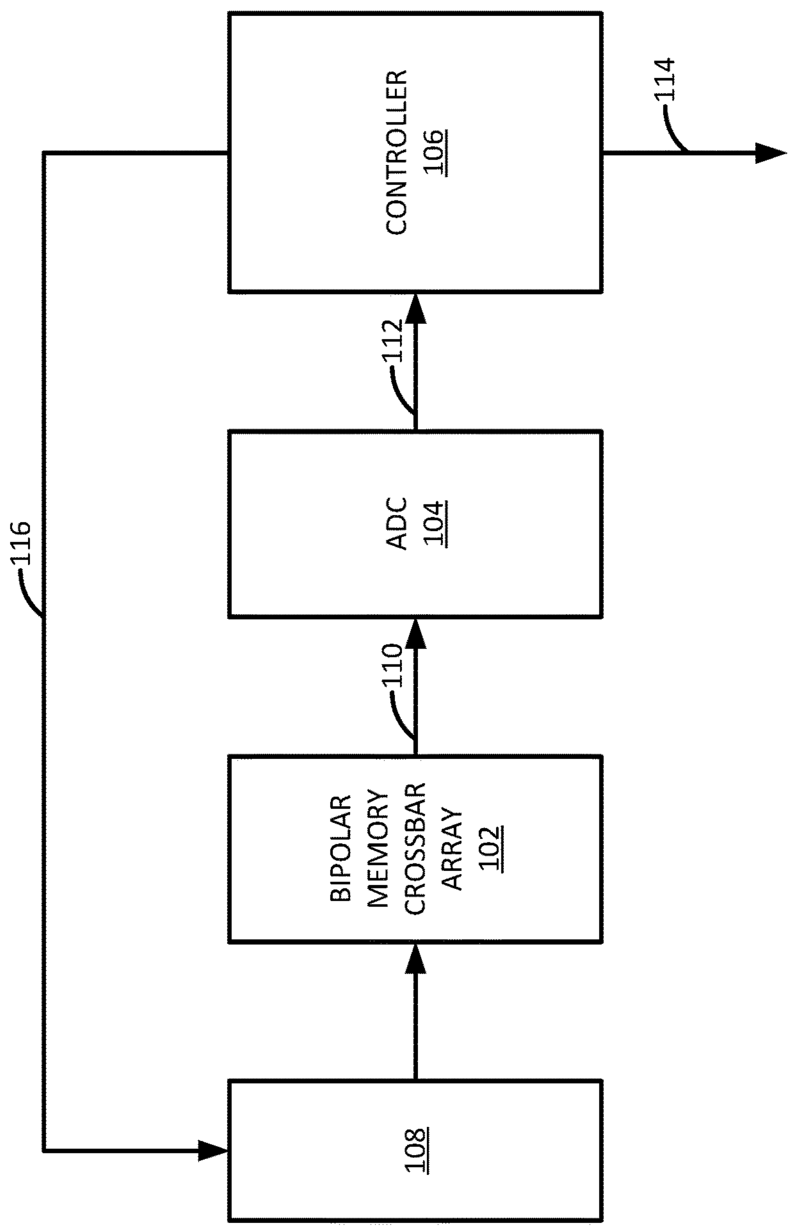
FIG. 1 is a block diagram of an example circuit to perform analog vector-matrix computations of the present disclosure.

Examples described herein provide a memory cell that improves vector-matrix operations or calculations. Vector-matrix operations can be used for different logical networks. For example, vector-matrix operations can be used for Hopfield networks or dot product engine (DPE) systems. Current hardware implementations of Hopfield networks or DPE systems can use complex circuits or elaborate complementary metal oxide semiconductor (CMOS) networks. The networks may require a separate unit for each operation that is performed (e.g., separate operations on positive and negative values). This may consume more power and use a larger area. As a result, the memory devices may be larger.

The present disclosure provides a memory cell that performs vector-matrix operations on bipolar input vectors (vectors that have both positive and negative values). The memory cell may include a 2×2 array of memristors that can be arranged in a memory crossbar array. Each memory cell of the memory crossbar array can be programmed to represent a value of a weight matrix that includes both positive and negative values.

In other words, the memory cell of the present disclosure allows a single memory crossbar array to be deployed to handle vector-matrix operations for both positive and negative input values. In contrast, previous systems may use a separate memory crossbar array for positive input values and negative input values. As a result, the memory cell of the present disclosure allows a circuit to have less units resulting in lower power consumption. In addition, the memory cell of the present disclosure may allow the circuit to have a smaller area footprint to allow for smaller overall memory devices.

Vector-matrix operations are mathematical functions used in various computer applications, including in data, image, sound, and video processing. Vector-matrix operations often involve a vector of values being multiplied by a matrix to produce a vector result. Examples of vector-matrix multiplications may include dot-product computations, linear transformations, cross-products, and others. However, vector-matrix multiplications may be very computation-intensive, and may be too resource-hungry to be optimally implemented with a general processor.

Memory cells are devices that may be used as components in a wide range of electronic circuits, such as memories, switches, radio frequency circuits, and logic circuits and systems. In a memory structure, a crossbar array of memory devices, which may include memristors, may be used. When used as a basis for memory devices, the resistance (or conductance) level of a memory cell may be used to store a value. The resistance of a memory cell may be changed by applying an electrical stimulus, such as a voltage or a current, through the memory cell. Generally, at least one channel may be formed that is capable of being switched between at least two states—one in which the channel forms an electrically conductive path ("on") and one in which the channel forms a less conductive path ("off"). In some other cases, conductive paths represent "off" and less conductive paths represent "on". Furthermore, memory cells may also behave as an analog component with variable conductance. For example, a range of conductance levels of the memristor may be used to represent a range of analog values.

In some applications, a memory crossbar array can be used to perform vector-matrix computations. The use of memory cells at junctions or cross-points of the crossbar array enables programming the resistance (or conductance) at each such junction. For example, the highest and lowest resistance values of the memory cells in the memory array may correspond to a maximum and a minimum resistance of any memory cell in the array. Every other memory cell may be mapped to a resistance according to its ratio with the highest and lowest resistance values. Each element of an input vector may be converted into an analog input voltage and applied to each corresponding row line of the crossbar array. The input voltage from each row line of the crossbar is weighted by the conductance of the resistive memory cells in each column line and accumulated as the current output from each column line. Ideally, if wire resistances can be ignored, the current, I, flowing out of the crossbar array will be approximately $I^T = V^T G$, where V is the input voltage and G is the conductance matrix, including contributions from each memory cell in the crossbar array.

However, analog computations may not work properly if either or both of an input vector and an input matrix have negative values. Yet, negative numbers are involved in various real world applications. As noted above, examples disclosed herein provide for a memory cell that can be used in circuits to calculate vector-matrix multiplications involving negative values. A negative value may be represented as a two bit positive complementary value. The memory cell of the present disclosure may be designed to perform vector-matrix operations having the two bit positive complementary values.

FIG. 1 illustrates an example circuit 100 of the present disclosure. In one example, the circuit 100 may be hardware that is implemented to perform analog vector-matrix computations. The circuit 100 may include a bipolar memory crossbar array 102, an analog to digital converter (ADC) 104, and a controller 106.

In one example, an input vector 108 may be provided to the bipolar memory crossbar array 102. The input vector 108 may include both positive and negative values. However, unlike previous systems that performed analog vector-matrix computations, the input vector 108 may processed by the bipolar memory crossbar array 102. In other words, unlike previous systems, the input vector 108 including both positive and negative values is not split into a vector of only negative values and a vector of only positive values.

In addition, a single bipolar memory crossbar array 102 may process the input vector 108. In other words, the present disclosure eliminates the use of a memory crossbar array with a positive weight matrix and a separate memory crossbar array with a negative weight matrix.

In one example, the input vector 108 may be converted into two bit complementary values that are all positive values for each value of the input vector 108. To illustrate, the two bit complementary value of −1 may be represented as [0, 1] and the two bit complementary value of +1 may be represented as [1, 0]. Thus, if the input vector is [−1, 1, 1], the input vector may be converted into two bit complementary values that are positive as ([0, 1], [1, 0], [1, 0]).

The bipolar memory crossbar array 102 may be designed to perform weight multiplications on both positive and negative values that have been converted. In one example, the weight matrix for the bipolar memory crossbar array 102 may also include positive and negative values. Each value within the weight matrix may also be converted into a 2×2 array of complementary two bit values. For example, if a value of the weight matrix is −1 the value may be converted into a 2×2 array as $$\begin{bmatrix} 0 & 1 \\ 1 & 0 \end{bmatrix}.$$

similarly, if the value of the weight matrix is +1 the value may be converted into a 2×2 array as $$\begin{bmatrix} 1 & 0 \\ 0 & 1 \end{bmatrix}.$$

In one example, the bipolar memory crossbar array 102 may include an array of memory cells. Each memory cell may include a 2×2 array of memristors that can be programmed to have a particular value that is associated with the weight matrix for a particular vector-matrix computation. A controller 106 may send a control signal 116, or multiple control signals 116, which can be addressed to each individual memristor in the bipolar memory crossbar array 102 to set the value of the memristor.

In one example, the input vector 108 may be processed by the bipolar memory crossbar array 102 to generate an analog output 110. The analog output 110 may be an output voltage or output current. The analog output 110 may be fed to the ADC 104. The ADC 104 may convert the analog output 110 into a digital output 112. The digital output 112 may be fed to the controller 106. The controller 106 may then provide an output 114. The output 114 may be sent to another component within a computing device having the circuit 100, to a display, and the like. The output 114 may be used for further computations performed by the computing device.

Figure 2:
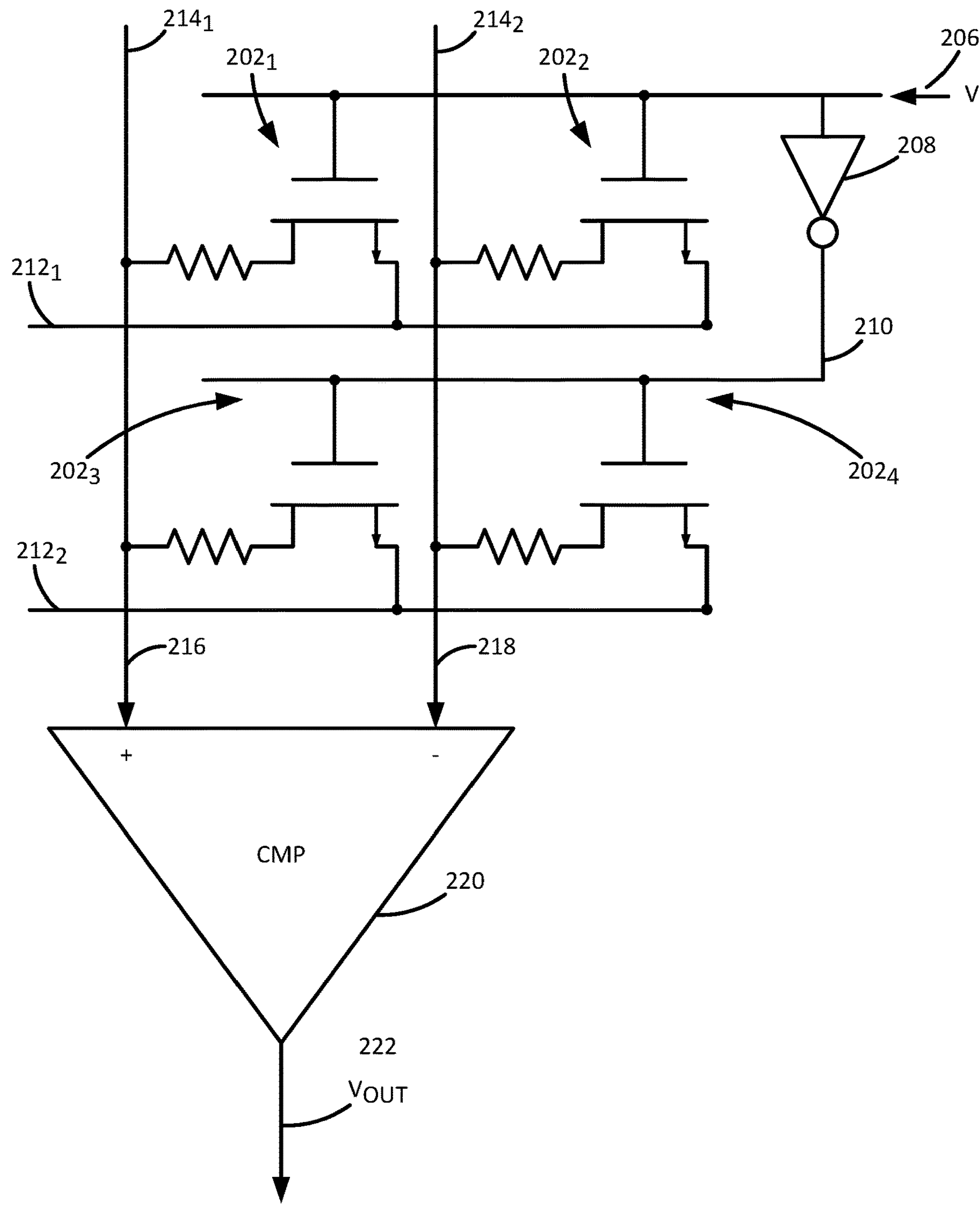
FIG. 2 is a block diagram of an example 2×2 memristor array of the present disclosure.

FIG. 2 illustrates a block diagram of an example 2×2 memristor array 200 of the present disclosure. As discussed above, the memory cells of the bipolar memory crossbar array 102 may include 2×2 memristor arrays 200.

A memristor may be a resistive memory element. A resistive memory element has a resistance that changes with an applied voltage or current. In some examples, the resistive memory element may "memorize" its last resistance. In this manner, each resistive memory element may be set to at least two states. In many examples, a resistive memory element may be set to multiple resistance states, which may facilitate various analog operations. The multiple resistance states may allow the representation of various values in a matrix. The resistive memory element may accomplish these properties by having a memristor, which may be a two-terminal electrical component that provides memristive properties, as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of bipolar memory crossbar array 102.

In one example, the 2×2 memristor array 200 may include memristors $\mathbf{202}_1$, $\mathbf{202}_2$, $\mathbf{202}_3$, and $\mathbf{202}_4$ (hereinafter also referred to individually as a memristor 202 or collectively as memristors 202). In one example, the memristors 202 may be located at each unique intersection of row lines $\mathbf{212}_1$ and $\mathbf{212}_2$ and column lines $\mathbf{214}_1$ and $\mathbf{214}_2$. In one example, the memristors may include other components, such as access transistors or selectors. For example, each memristor 202 may be coupled to an access transistor between the intersection of the row lines $\mathbf{212}_1$ and $\mathbf{212}_2$ and the column lines $\mathbf{214}_1$ and $\mathbf{214}_2$. The access transistors may facilitate the targeting of individual or groups of memristors 202 for the purpose of reading from or writing to a particular memristor.

In one example, the row lines $\mathbf{212}_1$ and $\mathbf{212}_2$ may be electrodes or selector lines. The selector lines may be coupled to a selector device (e.g., the controller 106). A selector may be a two-terminal device or circuit element that admits a current that depends on the voltage applied across the terminals. In some examples, a selector may be coupled to each memristor 202 to facilitate the targeting of individual or groups of memristors 202. For example, a selector may do so by acting like an on-off switch, and it may mitigate sneak current disturbance.

In one example, the column lines $214_1$ and $214_2$ may be electrodes or bit lines. For example, the column line $214_1$ may be a bit line and the column line $214_2$ may be a bit line bar. The column lines $214_1$ and $214_2$ may also be used to set a value of each memristor 202.

In one example, memory cells of the bipolar memory crossbar array 102 of the present disclosure may use a 2×2 array of memristors 202 since the values of the input vector 108 are converted into two bit complementary positive values. For example, if a value of the input vector 108 is −1, the input may be converted as [0, 1], as described above.

In one example, the 2×2 memristor array 200 may receive an input 206 as a voltage that represents a value of 0. An inverter 208 may invert the input 206 to a value that represents a value of 1. In one example, a digital to analog converter (DAC) (not shown) may be used to convert the digital value into a corresponding voltage that represents the digital value. Thus, the first row of memristors $202_1$ and $202_2$ may receive an input 206 of 0 and the second row of memristors $202_3$ and $202_4$ may receive an inverted input 210 of 1. Thus, in the example 2×2 memristor array 200, the value of an input vector −1 may be input as an input vector [0,1].

Similarly, if a value of the input vector 108 was +1, the value may be converted into [1, 0]. The input 206 may receive a voltage associated with the value of 1 and the inverter 208 may invert the value to a voltage associated with a value of 0.

In one example, the memristors $202_1$ and $204_4$ may be designed to have the same value. The memristors $202_2$ and $202_3$ may also be programmed to have the same value. The value of the memristors 202 may be programmed according to a weight matrix or an input matrix as described above. The controller 106 may send control signals 116 addressed to each memristor 202 to set a value of the memristor in accordance with the weight matrix. The control signals 116 may change the resistance range of the memristor 202. The control signals 116 may define a number of values to be applied to the memristors 202.

For example, a value of the weight matrix may be −1. As noted above, the value may be converted into a 2×2 matrix of positive values for the weight matrix. As a result, −1 may be represented as $$\begin{bmatrix} 0 & 1 \\ 1 & 0 \end{bmatrix}.$$

The controller 106 may send control signals 116 to the 2×2 memristor array 200 to set the value of the memristor $202_1$ an $202_4$ to 0 and the value of the memristor $202_2$ and $202_3$ to 1. The 2×2 array of memristors 202 may then be multiplied against the input vector value of [0, 1] for a value of −1.

In one example, 2×2 memristor array 200 may then generate an output 216 and an output 218. The output 216 and the output 218 may be voltages or currents that are associated with a particular value or result of the vector-matrix computation performed by the 2×2 memristor array 200 on the input 206. The output 216 and 218 may then be fed to a comparator (CMP) 220 that may sum the outputs 216 and 218 to compute an output 222. The output 222 may be a voltage or a current that is associated with the value computed by the comparator 220. In one example, the output 222 may be fed as the analog output 110 that is fed to the ADC 104 in FIG. 1 to generate the digital output 112.

Figure 3:
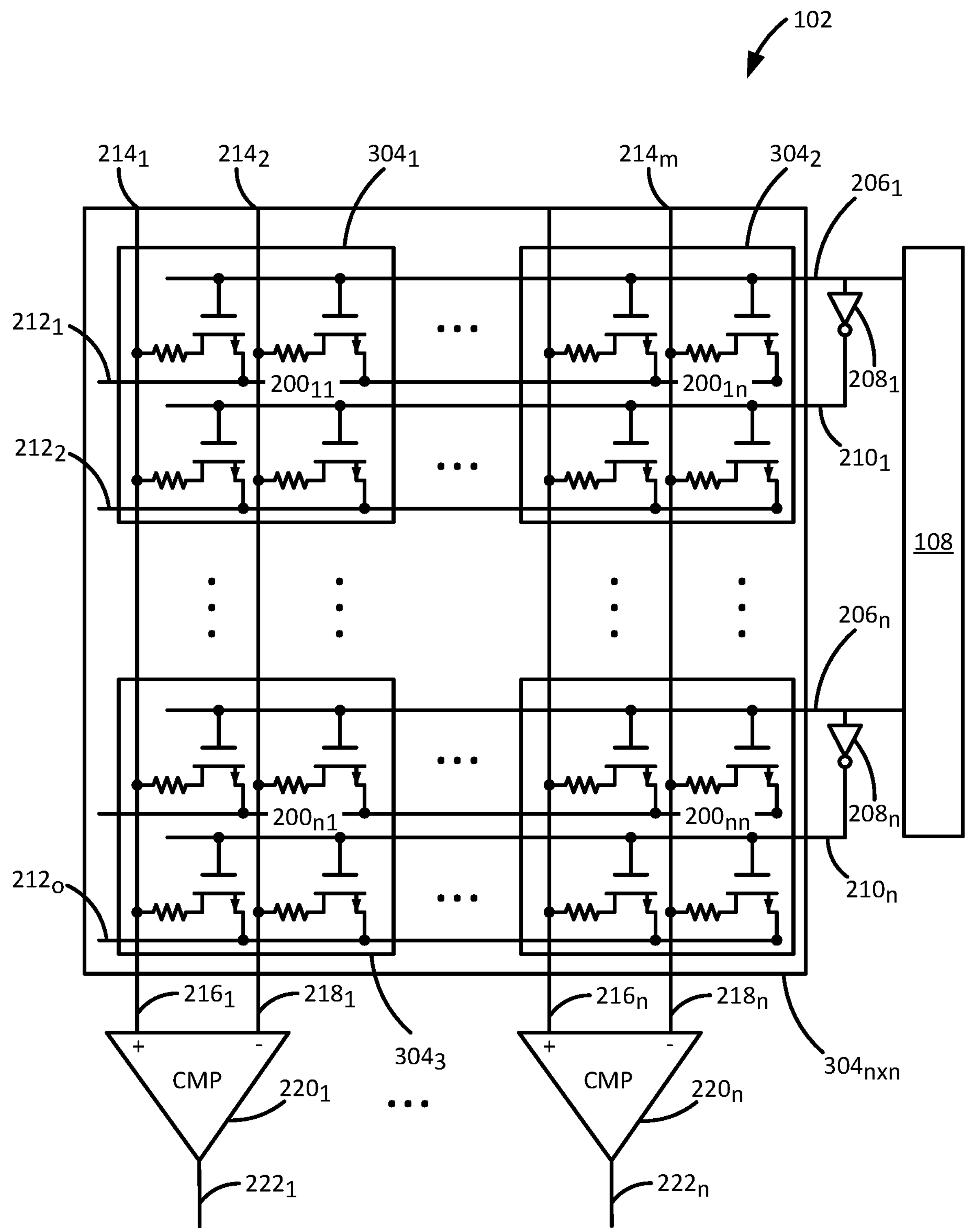
FIG. 3 is a block diagram of an example crossbar with memristor arrays of the present disclosure.

In one example, an array of the 2×2 memristor arrays 200 may be combined to form the bipolar memory crossbar array 102. FIG. 3 illustrates an example of the 2×2 memristor arrays 200 arranged in an n×n array. The bipolar memory crossbar array 102 may comprise an array of memory cells $304_1$ to $304_{n \times n}$. The number of memory cells may be a function of a number of values in a weight matrix. For example, if there are nine values in the weight matrix, then the bipolar memory crossbar array 102 may include nine memory cells 304.

Each memory cell may be comprised of a 2×2 memristor array 200. The 2×2 memristor arrays 200 may be arranged in an n×n array. Thus, if there are nine memory cells 304, there may be three rows of 2×2 memristor arrays 200, where each row has three columns of 2×2 memristor arrays 200. A plurality of rows $212_1$ to $212_o$ and a plurality of columns $214_1$ to $214_m$ may be deployed for the n×n array.

In one example, each row of 2×2 memristor arrays may share an input 206, an inverter 208, and an inverted input 210. In one example, each column of the memory cells 304 may generate an output 216 and 218 that may be fed into a comparator 220. For example, a first column of memory cells 304 may generate an output $216_1$ and $218_1$ that are fed to a comparator $220_1$. The comparator $220_1$ may then generate an output $222_1$. A last column of the memory cells 304 may generate outputs $216_n$ and $218_n$ that are fed to a comparator $220_n$. The comparator $220_n$ may then generate an output $222_n$, and so forth.

Figure 4:
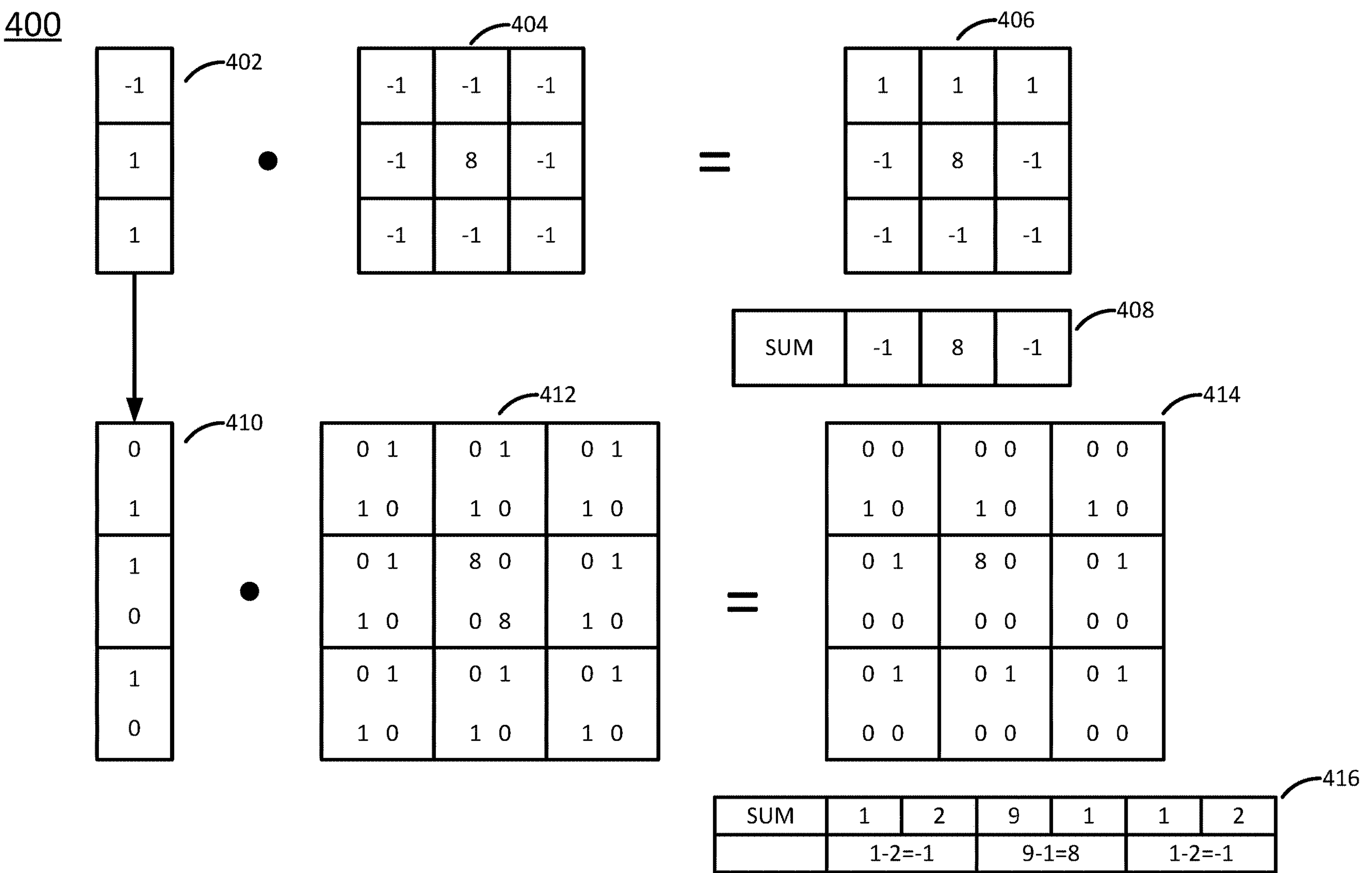
FIG. 4 is a block diagram of an example calculation performed by the cross bar with memristor arrays of the present disclosure.

FIG. 4 illustrates an example vector-matrix computation performed by the bipolar memory crossbar array 102. In one example, the input vector 108 may be represented by a matrix 402. The weight matrix may be represented by values shown in in a matrix 404. The dot product of the matrix 402 and the matrix 404 may be shown as a matrix 406. The sum or comparator function of each column of the matrix 406 may be shown in a matrix 408.

As noted above, in previous designs, an input vector 108 with positive and negative values may have been split into two different vectors (e.g., one vector with all positive values and one vector with all negative values). Then, two separate weight matrices (e.g., one with positive weight values and one with negative weight values) may be applied to the respective input vectors. The results may then be summed. However, this may use additional memory units that may add complexity and a larger area footprint.

In contrast, the present disclosure may convert the input vector 108 into a matrix 410 having two bit complementary positive values. In other words, each single value of the input vector 108 shown by the matrix 402 may be converted into all positive values. For example, −1 may be represented as [0, 1] and +1 may be represented as [1, 0].

Similarly, the weight matrix shown as the matrix 404 may be similarly converted to all positive values as shown by a matrix 412. Notably, the matrix 412 may allow both positive and negative weight values to be mixed within a single matrix 412 rather than using two separate matrices for positive values and negative values. The actual values in the matrices 404 and 412 are provided as examples. The values of the weight matrix may be predetermined for a particular application or function. Notably, each cell of the matrix 412 may be represented physically by the 2×2 memristor array 200, described above. Each memristor 202 of the bipolar memory crossbar array 102 may be programmed with a value that corresponds to each value in the matrix 412.

In one example, the dot product of the matrix 410 and the matrix 412 may be applied to generate a matrix 414. Then, each column of the matrix may be summed to generate an output illustrated by a matrix 416. For example, the first column and the second column may be represented by outputs $\mathbf{216}_1$ and $\mathbf{218}_1$ of the first column of memory cells 304 illustrated in FIG. 3. The outputs may then be applied to a respective comparator (e.g., the comparators $\mathbf{220}_1$ to $\mathbf{220}_n$ in FIG. 3) to generate outputs (e.g., the outputs $\mathbf{222}_1$ to $\mathbf{222}_n$).

Notably, the final values of the matrix 416 are the same as the final values of the matrix 408. Thus, the calculations performed by the matrix 402 and 404 may be implemented using positive values. The circuit 100 and the bipolar memory crossbar array 102 may be one such apparatus that can perform the calculation using all positive values with a single memory crossbar array.

Figure 5:
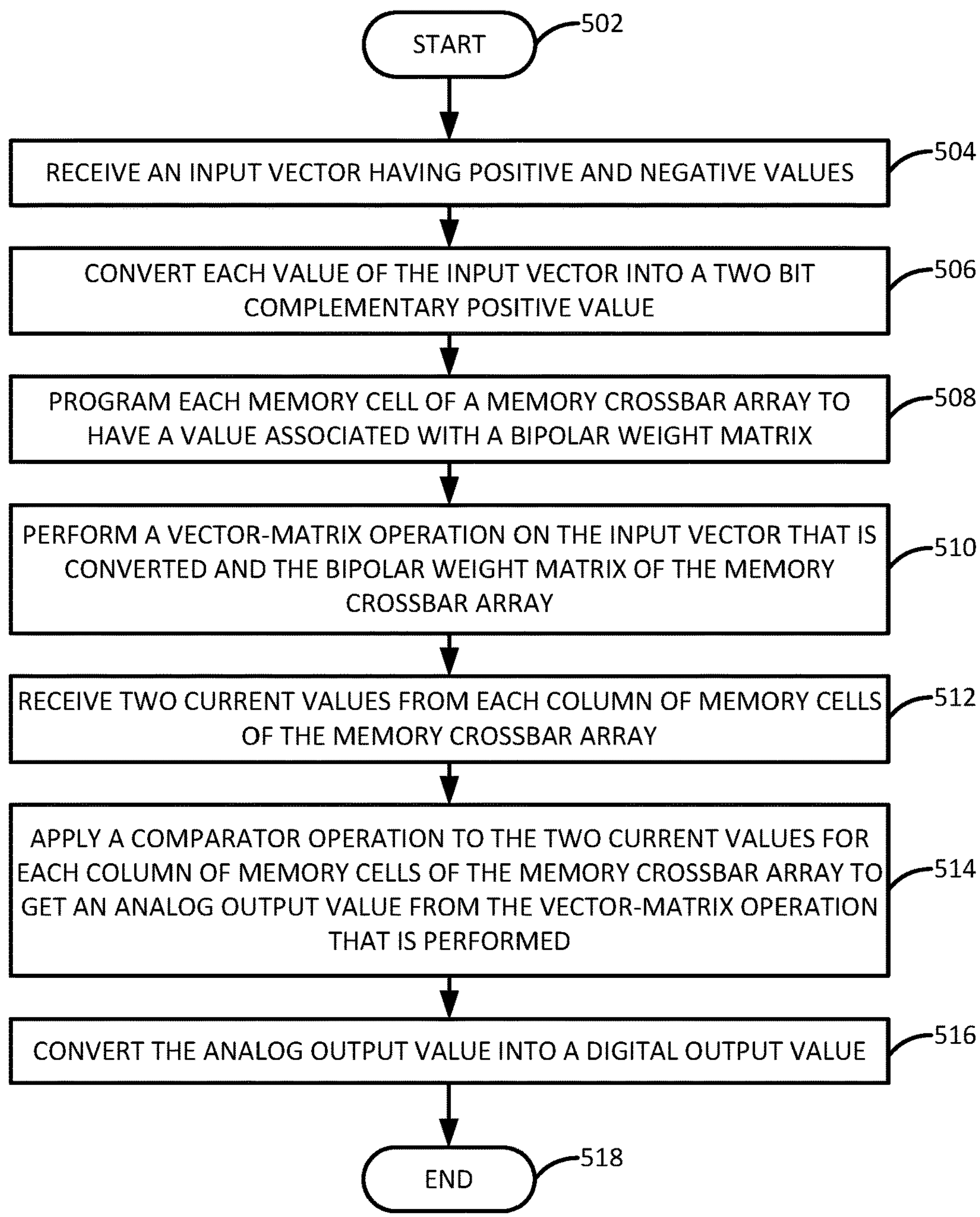
FIG. 5 is a flow chart of an example method for performing a vector-matrix operation in a memory crossbar array with an input vector having positive and negative values of the present disclosure.

FIG. 5 illustrates a flow diagram of an example method 500 for performing a vector-matrix operation in a memory crossbar array with an input vector having positive and negative values. In an example, the method 500 may be performed by the circuit 100 or the bipolar memory crossbar array 102.

At block 502, the method 500 begins. At block 504, the method 500 receives an input vector having positive and negative values. For example, the input vector may include a mix of both positive values and negative values. The input values may be a voltage or a current that corresponds to a digital input value. The voltages or currents may be determined via a DAC.

At block 506, the method 500 converts each value of the input vector into a two bit complementary positive value. For example, a −1 may be represented as [0, 1] and +1 may be represented as [1, 0].

At block 508, the method 500 programs each memory cell of a memory crossbar array to have a value associated with a bipolar weight matrix. Each memory cell may comprise a 2×2 array of memristors as described above. The values of the bipolar weight matrix may be predefined for a particular application or function. The bipolar weight matrix may include both positive and negative values in a single matrix.

Each value of the bipolar weight matrix may be converted into positive values using the two bit complementary positive value conversion applied to the values of the input vector. An example of the conversion is described above and illustrated by the matrix 412 in FIG. 4.

In one example, a controller may be used to address individual or groups of the memristors to set a value of the memristor. The value may correspond to the values in the converted weight matrix (e.g., the matrix 412 in FIG. 4).

At block 510, the method 500 performs a vector-matrix operation on the input vector that is converted and on the bipolar weight matrix of the memory crossbar array. For example, a dot product of each value in the input vector that is converted and each value of the bipolar weight matrix in the memory crossbar array may be applied.

At block 512, the method 500 receives two current values from each column memory cell of the memory crossbar array. In one example, the current values may correspond to the values obtained by the vector-matrix operation.

At block 514, the method 500 applies a comparator operation to the two current values for each column of the memory crossbar array to get an analog output value from the vector-matrix operation that is performed. For example, the two current values may be summed by the comparator to generate the analog output value.

At block 516, the method 500 converts the analog output value into a digital output value. The analog output value may be converted into a digital output value by a ADC. The digital output value may then be fed to the controller. The digital output value may be forwarded to another component in the computing device by the controller that may further process the digital output value. At block 518, the method 500 ends.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A memory cell, comprising:
a plurality of row lines;
a plurality of column lines, wherein the plurality of row lines and the plurality of column lines intersect to form a 2×2 array;
a plurality of memristors, wherein a memristor is coupled to each unique combination of a row line and a column line in the 2×2 array;
an input line coupled to a first row of memristors;
an inverter coupled to the input line; and
an inverted input line from the inverter coupled to the second row of memristors.

2. The memory cell of claim 1, wherein the plurality of row lines comprise a selector coupled to each one of the plurality of memristors to program a value of each one of the plurality of memristors.

3. The memory cell of claim 1, wherein one of the plurality of column lines comprise a bit line coupled to memristors in a first column of the 2×2 array, wherein the bit line is to set a value of the memristors in the first column of the 2×2 array.

4. The memory cell of claim 1, wherein one of the plurality of column lines comprise a bit line bar coupled to memristors in a second column of the 2×2 array, wherein the bit line bar is to set a value of the memristors in the second column of the 2×2 array.

5. The memory cell of claim 1, wherein the plurality of memristors comprises four memristors, wherein a first memristor is in a first row adjacent to a second memristor and wherein a third memristor is in a first column with the first memristor and in a second row adjacent to a fourth memristor that is in a second column with second memristor.

6. The memory cell of claim 5, wherein the first memristor and the fourth memristor have the same value and the second memristor and the third memristor have the same value.

7. The memory cell of claim 1, further comprising:
a current output from a first column of the 2×2 array;
a current output from a second column of the 2×2 array; and
a comparator coupled to the current output from the first column and the current output from the second column.

8. The memory cell of claim 1, wherein the input line and the inverted input line are to represent bipolar values using positive values.

9. A crossbar, comprising:
a plurality of row lines;
a plurality of column lines, wherein the plurality of row lines and the plurality of column lines intersect to form a matrix of memory cells;

a plurality of memory cells, wherein each memory cell is coupled to each unique combination of a row line and a column line in the matrix, wherein each memory cell comprises a 2×2 array of memristors;

an input line coupled to each first row of memristors in the 2×2 array of memristors of the plurality of memory cells in the matrix;

an inverter coupled to the input line; and an inverted input line coupled to a second row of memristors in the 2×2 array of memristors of the plurality of memory cells in the matrix.

10. The crossbar of claim 9, wherein plurality of row lines comprise a selector coupled to each one of the memristors of each one of the plurality of memory cells.

11. The crossbar of claim 9, wherein each one of the plurality of memory cells is programmed to a value of a weight matrix.

12. The crossbar of claim 11, wherein the 2×2 array of memristors for each one of the plurality of memory cells is programmed to a value of 0 or a positive value to represent positive and negative input values.

13. The crossbar of claim 11, wherein the weight matrix comprises a combination of positive weight values and negative weight values.

14. The crossbar of claim 9, further comprising:

for each column of memory cells of the plurality of memory cells, a current output from a first column of each one of the 2×2 array of memristors of the memory cells in a respective column;

a current output from a second column of each one of the 2×2 array of memristors of the memory cells in the respective column; and a comparator coupled to the current output from the first column and the current output from the second column for each column of memory cells.

15. A circuit, comprising:

a bipolar processing memory crossbar array to compute analog multiplications of a bipolar input vector;

an analog-to-digital converter (ADC) to generate digital results based on analog results computed by the bipolar processing memory crossbar array; and a controller to generate an output based on the digital results and to control a voltage provided to the bipolar processing memory crossbar array.

16. The circuit of claim 15, wherein the bipolar processing memory crossbar array comprises:

a plurality of row lines;

a plurality of column lines, wherein the plurality of row lines and the plurality of column lines intersect to form a matrix of memory cells; and a plurality of memory cells, wherein each memory cell is coupled to each unique combination of a row line and a column line in the matrix.

17. The circuit of claim 16, wherein each one off the plurality of memory cells comprises a 2×2 array of memristors.

18. The circuit of claim 17, further comprising:

an input line coupled to each first row of memristors in the 2×2 array of memristors of the plurality of memory cells in the matrix;

an inverter coupled to the input line; and an inverted input line coupled to a second row of memristors in the 2×2 array of memristors of the plurality of memory cells in the matrix.

19. The circuit of claim 15, wherein bipolar input vector comprises a combination of positive and negative values that are represented as positive values.

20. The circuit of claim 19, wherein a single bit value is represented as a two bit complementary value.

* * * * *